United States Patent
Ducourant (12)

(10) Patent No.: US 6,265,737 B1
(45) Date of Patent: Jul. 24, 2001

(54) CIRCUIT FOR INTEGRATING LIGHT-INDUCED CHARGES WITH IMPROVED LINEARITY

(75) Inventor: Thierry Ducourant, Voiron (FR)

(73) Assignee: Thomson Tubes Electroniques, Velizy Villacoublay (FR)

( * ) Notice: Subject to any disclaimer, the term of this patent is extended or adjusted under 35 U.S.C. 154(b) by 0 days.

(21) Appl. No.: 09/355,919

(22) PCT Filed: Feb. 6, 1998

(86) PCT No.: PCT/FR98/00233

§ 371 Date: Aug. 9, 1999

§ 102(e) Date: Aug. 9, 1999

(87) PCT Pub. No.: WO98/35312

PCT Pub. Date: Aug. 13, 1998

(30) Foreign Application Priority Data

Feb. 7, 1997 (FR) .................................................. 97 01429

(51) Int. Cl.[7] .......................... H01L 31/062; H01L 31/113
(52) U.S. Cl. .......................... 257/290; 257/296; 257/300
(58) Field of Search ................................ 257/290, 291, 257/292, 296, 300

(56) References Cited

U.S. PATENT DOCUMENTS 4,109,168 * 8/1978 Raymond ............................. 307/271
4,270,090 * 5/1981 Williams .............................. 324/457
5,777,495 7/1998 Arques et al. .

OTHER PUBLICATIONS

S. P. Singh, et al., IEEE Pacific Rim Conference on Communications, Computers and Signal Processing, Conference Proceedings, pp. 76–79, "A Simple High Frequency CMOS Transconductor", 1989.

* cited by examiner

Primary Examiner—Ngân V. Ngô
(74) Attorney, Agent, or Firm—Oblon, Spivak, McClelland, Maier & Neustadt, P.C.

(57) ABSTRACT

An integrator circuit for photogenerated charges which limits linearity defects. The circuit includes an integration capacitor with a first blade connected to a reference potential and a second blade having a variable potential which receives photogenerated charges. The circuit also includes a resetting MOS transistor of a first type connected to the variable potential at one terminal and to a supply potential on another. The MOS transistor represents a straight capacitance in parallel with the integration capacitor. One or more MOS transistors of a second type are connected to the variable potential and each have a stray capacitance in parallel with the integration capacitor. A variation in the voltage across the terminals of the integration capacitor causes a variation in the value of the straight capacitances of the MOS transistors of the second type which tends to compensate for the variation in the stray capacitance of the MOS transistor of the first type.

20 Claims, 2 Drawing Sheets

CIRCUIT FOR INTEGRATING LIGHT-INDUCED CHARGES WITH IMPROVED LINEARITY

BACKGROUND OF THE INVENTION

1. Field of the Invention

The invention relates to integrator circuits for photogenerated charges. Its object is in particular to limit the linearity defects caused by stray capacitances.

2. Discussion of the Background

Such circuits have the function of converting into voltage a quantity of current or charges which are accumulated during an integration time. Such integrator circuits are commonly used in various fields, examples of which include detector panels for digitized images, in particular radiological digitized images.

Taking as an example detector panels for digitized images, these generally have a matrix of photosensitive points. Each photosensitive point delivers a quantity of charges proportional to the intensity of a light signal to which it has been exposed. For each photosensitive point, these photogenerated charges are converted into a voltage value which is subsequently read then stored to form an elementary point of a digital image.

The commonest process for carrying out this conversion into voltage consists in charging a capacitor, as shown in FIG. 1.

FIG. 1 represents a conventional diagram of such an integrator circuit. The integrator circuit 1 has a so-called integration capacitor c1, one plate 2 of which is connected to a reference potential Vr: in the example represented, this reference potential consists of a supply potential V+ which is positive relative to the general earth of the circuit; the reference voltage may, however, be different, for example lying between the supply potential V+ and earth. The second plate 3 of the integration capacitor c1 is connected to a point "A" where a conductor 4 carrying charges Q arrives. These charges, which are intended to be integrated by the integration capacitor c1, are delivered by a charge generator 5, for example of the type consisting of a matrix of photosensitive points.

The point "A", that is to say the second plate 3 of the integration capacitor c1, constitutes a point at variable potential: the voltage at point "A" varies relative to the reference potential V+, as a function of the quantity of charge accumulated by the integration capacitor c1, according to the equation: $V=Q/c_1$ where V is the increasing voltage, Q is the quantity of charges and c1 is the integration capacitance.

The simplest way of producing a capacitor consists, for example, in forming it from the gate of a transistor of the MOS type (metal oxide semiconductor). However, capacitors of this type are nonlinear, and their value varies with this voltage applied to their terminals. Thus, in order to guarantee the linearity of the measurements, it is generally preferred to form an integration capacitor such as c1 using a capacitor of the MIM type (metal insulator metal) which is independent of voltage.

The integration capacitor c1 is called on to successively integrate the quantities of charges Q corresponding to different successive measurements; it is therefore necessary, before each measurement, to remove the charge stored by the integration capacitor in order to avoid voltage drifts, and to make it possible to start regularly from a stable and known value of the voltage across the terminals of the integration capacitor c1. This is accomplished by a so-called resetting operation, which consists in short-circuiting the integration capacitor c1 using an element fulfilling a switch function.

In order to carry out this resetting operation, it is conventional to use a semiconductor device such as a transistor of the MOS type controlled in all or nothing mode, as represented in FIG. 1 by a resetting transistor t1. Transistor t1 is of the "P" channel MOS type, and its source S1 is connected to the first plate 2 of the integration capacitor c1 and therefore to the reference voltage V+. The drain D1 of transistor t1 is connected to the point "A" at variable potential, that is to say to the second plate 3 of the integration capacitor c1, and its gate G is connected to a resetting control circuit 6 from which it receives a resetting control signal.

One drawback of the conventional layout described above resides in the fact that, since the drain D1 of the resetting transistor t1 is connected to the second plate 2, it brings in parallel with the integration capacitor c1 a stray capacitance cp1 (represented by dashes in FIG. 1) which is formed by a junction which this drain D1 constitutes. By way of explanation, it is known that the drain D1, and also the source S1, of such a transistor t1 each consist of a region which is implanted in a semiconductor substrate with which they each form a junction.

The drain and source each consist of a semiconducting region, doped with a conductivity type which is opposite to that of the substrate. Thus, for example, a P type or P channel transistor has an N doped substrate which is brought to the positive potential of the supply voltage applied to the circuit (as represented in FIG. 1 where the substrate B1 of transistor t1 is connected to the positive potential V+); the drain and the source of this transistor are formed by "N" doped regions implanted in this substrate. An N type transistor is, conversely, referenced relative to a substrate which is at the negative potential of the supply voltage.

Under these conditions, the drain D1 consists of a junction biased in the "off" direction, that is to say by a reversed-biased diode, which diode consequently constitutes a stray capacitance cp1 arranged in parallel with the integration capacitor c1 (as is represented by dashes in the figure).

Since the voltage across the terminals of the integration capacitor c1 varies because of the integration of the charges and, furthermore, as already indicated above, the value of the stray capacitance cp1 is strongly dependent on the voltage across these terminals, the resulting capacitance has a significant nonlinear component. This nonlinear part of the capacitance has of course an affect which is all the more marked as the capacitance of the integration capacitor c1 is small.

It should be noted that the problem thus created by the presence of the switching element constituted by the transistor t1 is all the more pronounced if an integrator with high sensitivity is desired, which sensitivity becomes higher as the integration capacitance becomes smaller.

In the case, for example, of an integrator circuit receiving charges produced by a photosensitive matrix, it is common for the integration capacitor to have a capacitance of the order of 0.3 to 0.5 pF. The nonlinearity generated just by the stray capacitance, that is to say by the presence of the switch constituted by the transistor t1, may reach 1%, and even extend to 5%, in the case of an operating voltage range corresponding to a voltage variation of the order of 3 volts.

With the aim of reducing the effect of the stray capacitance cp1, one solution consists in using, as the switch, MOS transistors having a small junction area. However, the limits of this solution are rapidly reached without really providing satisfaction, because the constituent elements of these transistors cannot be made small enough for technologically related reasons.

SUMMARY OF THE INVENTION

With a view to reducing, or even eliminating, from an integration circuit the detrimental effects of a stray capacitance consisting of a semiconductor junction provided, in particular, by a transistor as explained above, the invention proposes to compensate for the different variations caused by this stray capacitance, by variations which are made in an opposite direction and are caused by at least one other semiconductor junction.

The invention proposes an integrator circuit for photogenerated charges, having an integration capacitor of which a first plate is connected to a reference potential and a second plate to a point at variable potential where it receives the photogenerated charges, a resetting MOS transistor of a first type, connected on the one hand to the point at variable potential and on the other hand to a supply potential, this transistor of the first type having a stray capacitance in parallel with the integration capacitor. This integrator circuit is characterized in that it has one or more MOS transistors of a second type which are connected to the point at variable potential and each have a stray capacitance in parallel with the integration capacitor, so that a variation in the voltage across the terminals of the integration capacitor causes a variation in the value of each of the stray capacitances, the variation in the stray capacitances of the MOS transistors of the second type tending to compensate for the variation in the stray capacitance of the MOS transistor of the first type.

In this circuit, the MOS transistor of the first type may have its drain connected to the point at variable potential and its source connected to the supply voltage. This transistor has a switch function and its gate is connected to a resetting control circuit.

This circuit may have, as the MOS transistor of the second type, a MOS transistor which is connected via its drain to the point at variable potential and which receives the charges via its source. Its gate may be connected to an enabling circuit so as to form a switch allowing the charges to flow when it is in a closed state.

This circuit may have, as the MOS transistor of the second type, a MOS transistor connected via its source to the point at variable potential and via its drain to the supply potential. This MOS transistor of the second type may be controlled by its gate and have a switch function which, in an open state, fixes the potential of the point at variable potential, which makes it possible to obtain protection against dazzling.

If the circuit has the two MOS transistors of the second type which were described above, it is possible for their gates to be connected to the same enabling circuit.

The transistor of the first type is of the P type, whereas the transistors of the second type are of the N type.

An integrator circuit having a first semiconductor device, a so-called integration capacitor connected to a point at variable potential where it receives charges produced by a charge generator, the semiconductor device having a junction of a first type, of which a first region having a first conductivity type is connected to the point at variable potential, and of which a second region having a second conductivity type (the opposite of the first) is connected to a first supply potential by which the junction is biased in the reversed direction, furthermore has at least a second semiconductor device having a junction of a second type of which a first region having the second conductivity type is connected to the point at variable potential, and of which a second region having the first conductivity type is connected to a second supply potential by which the junction of the second type is reversed-biased.

BRIEF DESCRIPTION OF THE DRAWINGS

The invention will be understood more clearly on reading the following description of some of its embodiments, which description is given by way of nonlimiting example with reference to the appended drawings, in which.

DETAILED DESCRIPTION OF THE PREFERRED EMBODIMENTS

Figure 2:
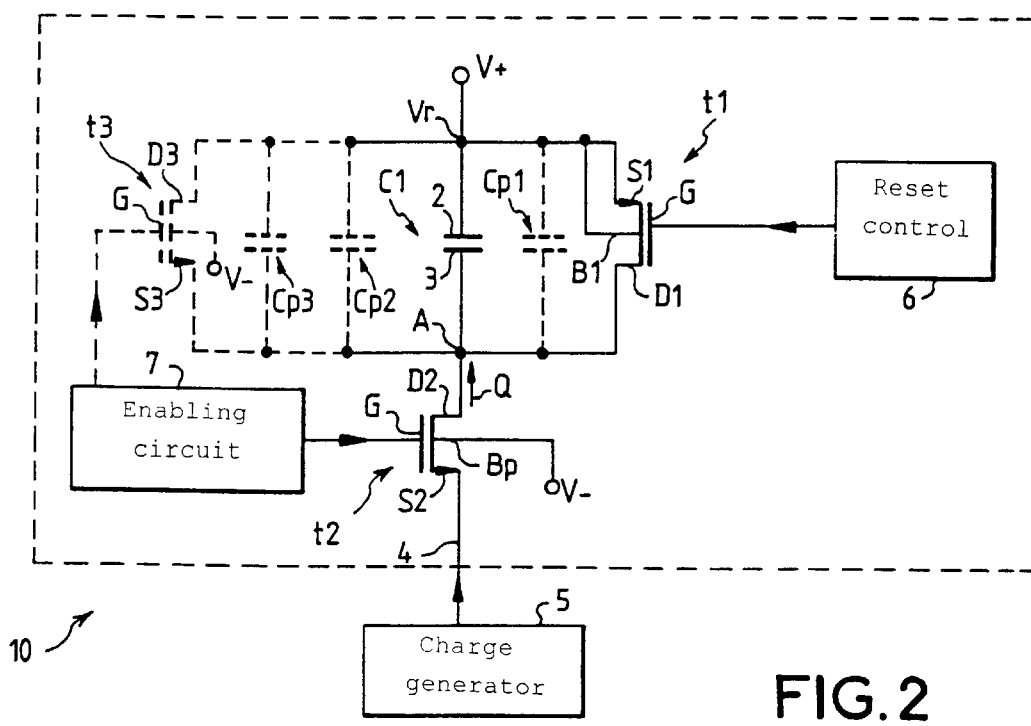
FIG. 2 represents the diagram of an integrator circuit according to the invention.

FIG. 2 schematically shows an integrator circuit 10 according to the invention.

The integrator circuit 10 has an integration capacitor c1 of the same type as that described with reference to FIG. 1. The first plate 2 of the integration capacitor c1 is connected to a reference potential Vr which, in the nonlimiting example described, consists of a positive potential V+ of a supply voltage. The second plate 3 receives, via a conductor 4, photogenerated charges represented as produced by a charge generator 5. This connection constitutes a point "A" referred to as "at variable potential" where the voltage varies as a function of the charges integrated by the integration capacitor c1.

As in the example described with reference to FIG. 1, a switch element is fitted in parallel with the integration capacitor c1, with a view to carrying out resetting operations. This switch function is fulfilled by a transistor t1 of the same MOS type as the transistor t1 in FIG. 1, that is to say of the P type in the example. The drain D1 of the transistor t1 is connected to the point "A" at variable potential; its source S1 is connected to the supply potential V+, which in the example described also corresponds to the first plate 2 of the integration capacitor c1; and its gate G is connected to a resetting control circuit 6.

As indicated above in the preamble, transistor t1 constitutes a semiconductor device having at least one junction jB1 (not shown in FIG. 2), the biasing of which junction is such that it constitutes a stray capacitance cp1 (shown by dashes in FIG. 2) added in parallel with the integration capacitor c1.

With a view to compensating for the effects produced by this aforementioned first junction of a first type, and according to one characteristic of the invention, the integrator circuit 10 furthermore has at least one other semiconductor device having at least one junction jB2 (not shown in FIG. 2) of a second type, having the following characteristics:

a) this junction jB2 of the second type has a first region which has a given conductivity type and which is connected to the point "A" at variable potential;

b) this junction jB2 of the second type differs from the junction jB1 of the first type, belonging to the first semiconductor device t1, in that its first region is of the conductivity type opposite that of the first region of the junction jB1 of the first type; thus, for example, if the first region of the junction jB1 of the first type is P doped, the first region of the junction jB2 of the second type is N doped;

c) lastly, this junction jB2 of the second type has a second region having the conductivity type opposite to that of the first region, which second region is connected to a second supply potential whose polarity relative to the point "A" at variable potential is such that this junction jB2 of the second type is reversed-biased.

The result of this is that this junction jB2 of a second type itself also constitutes a stray capacitance cp2 connected in parallel with the integration capacitor c1.

However, the second stray capacitance cp2, although of the same kind as the first stray capacitance cp1, differs from it in that it results from the reverse-biasing of a different junction, with a conduction type opposite to that of the junction which gave rise to the first stray capacitance cp1. Consequently, a variation in the voltage across the terminals of the integration capacitor c1 causes a variation in the value of each of the stray capacitances cp1, cp2 in opposite directions to one another. These variations in stray-capacitance values thus tend to compensate one another.

In the nonlimiting example described, the other or second semiconductor device consists of a second transistor t2 of the MOS type opposite to that of the MOS transistor t1, in the example with "N" channel, in order to contain an aforementioned junction of the second type.

The second transistor t2 is connected via its drain D2 to the point "A" at variable potential, and its substrate Bp is connected to the second supply potential V− mentioned above, the polarity of which is negative relative to the point "A" at variable potential. This is sufficient to make the connection of the junction corresponding to this drain D2, as well as to reverse-bias it, and consequently sufficient to form the second stray capacitance cp2. It is clear that this can also be obtained by another type of semiconductor device, for example by a diode. It should further be noted that, in the case of a MOS transistor, the fitting of a second stray capacitance cp2 could equally well be obtained by connecting the source of this transistor, rather than its drain, to the point "A" at variable potential. Thus, FIG. 2 shows in dashes a MOS transistor t3 of the second type, opposite to that of the MOS transistor t1, which has a stray capacitance cp3 in parallel with the integration capacitance c1. This MOS transistor t3 which, here, is of the N type has its source S3 connected to the point "A" at variable potential and its drain D3 connected to the first supply potential V+, which corresponds in the example to the first plate 2 of the integration capacitor c1 since Vr=V+. Its substrate Bp is also connected to the second supply potential V− mentioned above.

Since the second transistor t2 already has its drain D2 connected to the point "A" at variable potential, it can furthermore fulfill another extra function, such as for example to enable or disable the flow of the charges and their integration, as in the nonlimiting example represented in FIG. 2; specifically, in FIG. 2 the second transistor t2 is arranged between the point "A" at variable potential and the charge generator 5, to which generator it is connected via its source S2. It is controlled in all or nothing mode by an enabling circuit 7 to which its gate G is connected, so as to constitute a switch allowing the charges to flow when it is set in the "closed" state.

Of course, the second transistor could equally well fulfill an extra function, the important aspect being that it is connected to the point "A" at variable potential by its drain D2 or its source S2, in order to connect the second stray capacitance cp2 at this point.

The MOS transistor t3 of the second type can be controlled via its gate G and have a switch function which, in an open state, fixes the potential of the point "A" and makes it possible to provide protection against dazzling, which corresponds to the situation in which the potential at point "A" becomes very negative relative to the potential V+.

It should also be noted that the compensation can be obtained by a plurality of stray capacitances cp2, cp3 in parallel which are formed using a plurality of junctions of the second type, all connected to the point "A", and belonging to transistors and/or to diodes. Thus, for example, the integrator circuit 10 could have both the MOS transistor t2 of the second type and the MOS transistor t3 of the second type, which has just been described and which is arranged in parallel with the first transistor t1, that is to say it has its source S3 connected to the point "A" and its drain D3 connected to the first plate 2 of the integration capacitor c1, so that on the one hand its junction (of the same type as the junction of the second transistor t2) forms a stray capacitance cp3 set in parallel with that cp2 of the second transistor t2; and on the other hand this third transistor t3 fulfills another function, for example that of a switch with anti-dazzle function. When the integration circuit 10 has the two MOS transistors t2, t3 of the second type, their gates G may be connected to the same enabling circuit 7.

Figure 3:
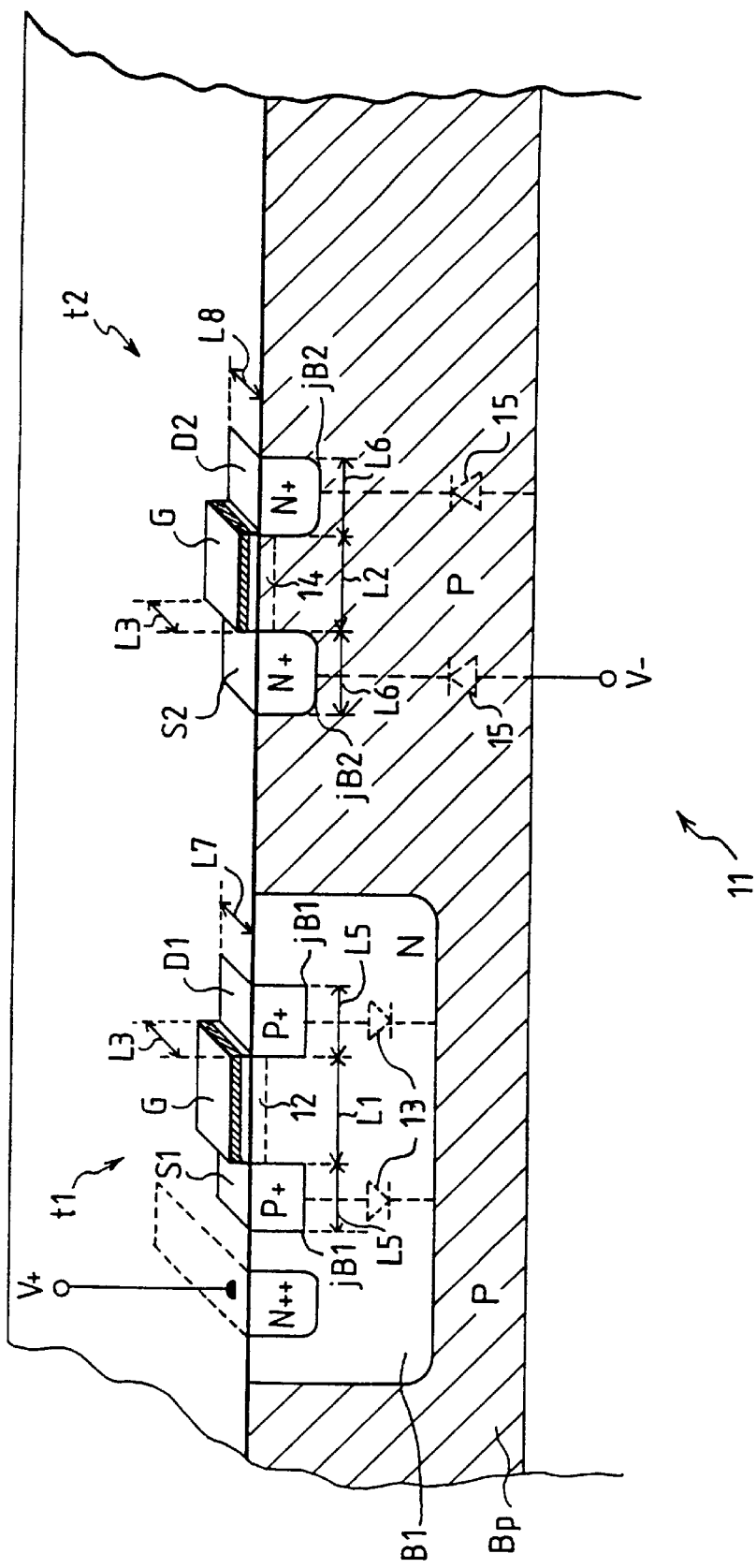
FIG. 3 represents a semiconductor structure illustrating the implementation of the invention.

FIG. 3 gives a simplified representation of a semiconductor substrate 11 carrying the two transistors t1, t2, illustrating the mechanisms which lead to formation of the stray capacitances cp1, cp2. The structure 11 is shown by a sectional view parallel to the channel of each of these transistors. It has a substrate referred to as the principal substrate Bp which is doped with a first conductivity type P and in which a wide region B1 forming the substrate of the first transistor t1 is implanted. This substrate B1 is doped with the second conductivity type (the opposite of the first), that is to say N.

The drain D1 and the source S1 of the first transistor t1 are each formed, in a way which is in itself conventional, by a P doped region implanted in the substrate B1. They are implanted at a distance from one another which represents the length L1 of the channel 12 of the transistor, above which channel the gate G is arranged. Since the drain D1 and the source S1 have a conductivity type P which is the opposite of that (N) of the substrate B1, this drain and this source each form with the substrate B1 a semiconductor junction jB1 of a diode 13 represented by dashes. The cathode of these diodes 13 corresponds to the substrate B1 and their anode corresponds to the drain and to the source, that is to say to the P doped region. The drain D1 and the source S1 each constitute the aforementioned first region of a junction jB1 of the first type, the substrate B1 of which is the second region.

Figure 1:
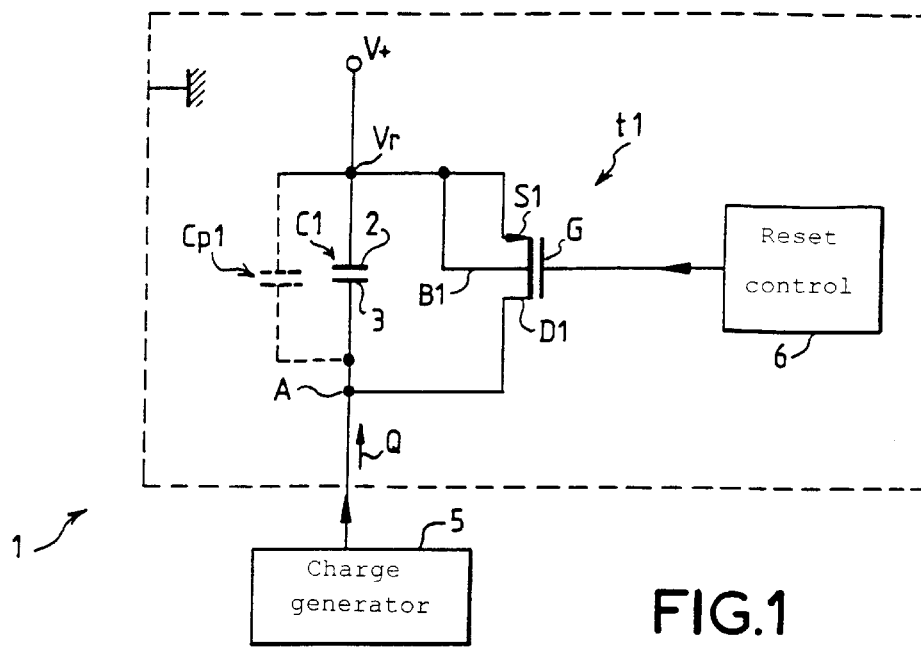
FIG. 1, already described, represents an integration circuit according to the prior art.

According to the diagrams in FIGS. 1 and 2, the substrate B1 of the first transistor t1 is connected to the first supply potential V+, whereas the drain D1 is connected to the point "A" at variable potential whose voltage is negative relative to this first potential V+. The result of this is that the diodes 13 are reverse-biased and, under these conditions, they each constitute a capacitor, of which the one corresponding to the drain D1 constitutes the first stray capacitance cp1 shown in FIGS. 1 and 2.

The drain D2 and the source S2 of the second transistor t2 are formed, by regions doped with the second conductivity type, that is to say N, implanted in the main substrate Bp (P doped). They are implanted at a distance from one another which represents the length L2 of the channel 14 of the transistor, above which channel the gate G is arranged. Since the drain D2 and the source S2 have a conductivity type Y which is the opposite of that of the substrate Bp, this drain D2 and this source S2 each form with this substrate Bp a semiconductor junction jB2 of a diode 15 represented by dashes. The anode of these diodes 15 corresponds to the main substrate Bp and their cathode corresponds to the drain D2 and to the source S2, that is to say to the N doped region. The drain D2 and the source S2 each constitute the aforementioned first region of a junction jB2 of the second type, the main substrate Bp of which is the second region.

The main substrate Bp of the second transistor t2 is connected to the second supply potential V−, whereas the drain D2 is connected to the point "A" at variable potential whose voltage is positive relative to this second potential V−. The result of this is that the diodes 15 are reverse-biased and, under these conditions, they each constitute a capacitor, of which the one corresponding to the drain D2 constitutes the second stray capacitance cp2 shown in FIG. 2.

If the first stray capacitance cp1 is formed by a plurality of semiconductor devices, each of them has a junction such as the junction of the first type jB1. The same is true as regards the second stray capacitance cp2: if it is formed by a plurality of semiconductor devices, each of them has a junction such as the junction of the second type jB2.

The description has been given assuming that the stray capacitance to be compensated was induced by a junction of the first type jB1, for which the compensation is provided using a junction jB2 of the second type, but of course the invention applies equally well in the converse case.

The value of the first and second stray capacitances cp1, cp2 produced respectively by one or more junctions of the first type jB1 and one or more junctions of the second type jB2, depends both on the junction biased voltage and the junction area: on the one hand, the value of the capacitance increases when the reverse-bias voltage decreases, and on the other hand the value of the capacitance increases when the junction area increases.

The integration of the charges by the integration capacitor c1 can generate, at variable potential point "A", a variation in voltage representing an operating voltage range VC contained in a potential difference formed between the first V+ and the second V− supply potentials.

Furthermore, with a view to optimizing the compensation for one another by the first and second stray capacitances cp1, cp2, in the operating voltage range or coding range VC intended, in which the integrator operates, the invention proposes adapting the dimensions of the junctions jB1, jB2 as a function of the position of the coding range within the potential difference formed between the first and second supply voltages V+, V−.

Between a first and a second junction surface Sj1, Sj2, of which the first Sj1 corresponds to all the junction surfaces of the first type jB1 which are connected to the point "A" at variable potential (and form the first stray capacitance cp1), and of which the second Sj2 corresponds to all the junction surfaces of the second type jB2 which are also connected to the said point "A" (and form the second stray capacitance cp2), the invention therefore proposes giving a larger dimension to that of the surfaces Sj1, Sj2 which corresponds to the type of junction jB1, jB2 which is referenced to that of the supply potentials V+, V− whose coding range VC is the furthest away.

For example, for an intended coding range of 3 volts:
a) Assuming, on the one hand, that the first and second supply potentials V+, V− are respectively +5 volts and −5 volts relative to earth, and that on the other hand the reference voltage Vr to which the first plate 2 of the integration capacitor c1 is connected is a voltage of +1.5 volt relative to earth: under these conditions the central voltage Vc of the coding range is at the earth potential, that is to say centered relative to the supply potentials V+, V− and the junction areas Sj1, Sj2 can be substantially equal.
b) For supply potentials V+, V− respectively at +5 volts and −5 volts as above, but with a different reference potential Vr (to which the first plate 2 of the integrator capacitor c1 is connected) consisting for example of the first supply potential V+ (+5 volts): in this case, for a coding range of 3 volts, the central value of this range is at +3.5 volts, and therefore closer to the positive potential V+ or first supply potential than the second supply potential V− (negative); under these conditions the second junction area Sj2 (corresponding to the second type of junction jB2) is larger than the first junction area Sj1.
c) Lastly, if the central value of the coding range is closer to the negative supply potential, that is to say the second supply potential of V−, the first junction area Sj1 is larger than the second area Sj2.

In certain fields, such as for example that of image detectors, in which the charges to be measured and therefore to be integrated are produced by photosensitive matrices, it is common to supply the integrator, before applying the charges to be measured, with a quantity of charges forming, for example, so-called "driving" charges having a calibrated level. The integration of these driving charges causes a variation in the voltage across the terminals of the integration capacitor, the effect of which variation is to offset the coding range.

In the configuration described above, the invention has made it possible to obtain highly advantageous results, because residual linearity values have been estimated at 0.05% whereas they are generally of the order of 0.5% without the compensation according to the invention. These results are obtained in the context of a technology of the 2 $\mu$m (channel length) CMOS type. The compensation for one stray capacitance by another was optimized for a coding voltage range of 3 volts, centered on +2 volts, and with first and second supply potentials V+, V− of respectively +5 volts and −5 volts, and the reference voltage Vr consisting of the first supply potential V+. The first stray capacitance cp1 consisted of the drain of a P channel MOS transistor, fitted in the same way as the first transistor t1; and the second stray capacitance cp2 originated from the drain of an N channel MOS transistor fitted in the same way as the second transistor t2. The junction area imparted to the drain of the N channel transistor was 70 $\mu m^2$, and the junction area of the drain of the P channel transistor was 25 $\mu m^2$. Of course, these dimensions are given only by way of indication and should be optimized for each type of technological process.

It may be difficult to reduce the size of certain semiconductor junctions, in particular for "contact-making" reasons, whereas their size can readily be increased without problems.

In the semiconductor structure 11 represented in FIG. 3 by way of nonlimiting example, the areas of the junctions jB1, jB2 can be readily increased without modifying either the length L1, L2 of the channels 12, 14 or the width of these channels, which is particularly defined by the width L3 of the gates G. It is sufficient to that end to increase, for example, parallel to the length of channels 12, 14, the length L5, L6 of one of the implantations which constitute the drains D1, D2 and the sources S1, S2; of course the increase in these lengths L5, L6 should in this case rather be carried out on the side opposite the one bordering the channel 12, 14. It is also possible, whether or not in combination with the aforementioned increase in the length LS, L6, to increase these junction areas by increasing width L7, L8 of the implantations (parallel to the width L3 of the channel 12, 14) which form these drains and these sources.

The above description has been given assuming that the stray capacitance to be compensated was induced by one or more junctions of the first type jB1, for which the compensation is provided using one or more junctions jB2 of the second type, but of course the invention applies equally well in the converse case.

An integrator circuit 10 according to the invention can advantageously be used in all the input stages of most charge amplifiers. Such charge amplifiers are commonly combined with light sensors of the type constituted by matrices of photodetectors.

What is claimed is:

1. Integrator circuit for photogenerated charges, having an integration capacitor of which a first plate is connected to a reference potential and a second plate to a point "A" at variable potential where it receives the photogenerated charges, a resetting MOS transistor of a first type, connected on the one hand to the point "A" at variable potential and on the other hand to a supply potential, this MOS transistor of the first type having a stray capacitance in parallel with the integration capacitor characterized in that it has one or more MOS transistors of a second type, which is the opposite of the first type, which are connected to the point "A" at variable potential and each have a stray capacitance in parallel with the integration capacitor, so that a variation in the voltage across the terminals of the integration capacitor causes a variation in the value of each of the stray capacitances, the variation in the stray capacitances of the MOS transistors of the second type tending to compensate for the variation in the stray capacitance of the MOS transistor of the first type.

2. Integrator circuit according to claim 1, characterized in that the MOS transistor of the first type has its drain connected to the point "A" at variable potential and its source connected to the supply potential.

3. Integration circuit according to claim 1, characterized in that the MOS transistor of the first type has a switch function, its gate being connected to a resetting control circuit.

4. Integration circuit according to claim 1, characterized in that, as the MOS transistor of the second type, it has a MOS transistor which is connected via its drain to the point "A" at variable potential and which receives the photogenerated charges via its source.

5. Integration circuit according to claim 4, characterized in that the MOS transistor of the second type has a switch function allowing the charges to flow when it is closed, its gate being connected to an enabling circuit.

6. Integration circuit according to claim 1, characterized in that, as the MOS transistor of the second type, it has a MOS transistor connected via its source to the point "A" at variable potential and via its drain to the supply potential.

7. Integration circuit according to claim 6, characterized in that the MOS transistor of the second type is controlled via its gate and has a switch function which fixes the potential of the point "A" when it is open in order to provide protection against dazzling.

8. Integration circuit according to claim 4, characterized in that the MOS transistors of the second type each have their gate connected to the same enabling circuit.

9. Integration circuit according to claim 1, characterized in that the MOS transistor of the first type is a P type transistor, and in that the MOS transistors of the second type are N type.

10. Integration circuit according to claim 2, characterized in that the MOS transistor of the first type has a switch function, its gate being connected to a resetting control circuit.

11. Integration circuit according to claim 2, characterized in that, as the MOS transistor of the second type, it has a MOS transistor which is connected via its drain to the point "A" at variable potential and which receives the photogenerated charges via its source.

12. Integration circuit according to claim 3, characterized in that, as the MOS transistor of the second type, it has a MOS transistor which is connected via its drain to the point "A" at variable potential and which receives the photogenerated charges via its source.

13. Integration circuit according to claim 2, characterized in that, as the MOS transistor of the second type, it has a MOS transistor connected via its source to the point "A" at variable potential and via its drain to the supply potential.

14. Integration circuit according to claim 3, characterized in that, as the MOS transistor of the second type, it has a MOS transistor connected via its source to the point "A" at variable potential and via its drain to the supply potential.

15. Integration circuit according to claim 4, characterized in that, as the MOS transistor of the second type, it has a MOS transistor connected via its source to the point "A" at variable potential and via its drain to the supply potential.

16. Integration circuit according to claim 5, characterized in that, as the MOS transistor of the second type, it has a MOS transistor connected via its source to the point "A" at variable potential and via its drain to the supply potential.

17. Integration circuit according to claim 5, characterized in that the MOS transistors of the second type each have their gate connected to the same enabling circuit.

18. Integration circuit according to claim 6, characterized in that the MOS transistors of the second type each have their gate connected to the same enabling circuit.

19. Integration circuit according to claim 2, characterized in that the MOS transistor of the first type is a P type transistor, and in that the MOS transistors of the second type are N type.

20. Integration circuit according to claim 3, characterized in that the MOS transistor of the first type is a P type transistor, and in that the MOS transistors of the second type are N type.

* * * * *